(12) United States Patent
Abe

(10) Patent No.: US 7,881,141 B2
(45) Date of Patent: Feb. 1, 2011

(54) SEMICONDUCTOR DEVICE AND REFRESH METHOD

(75) Inventor: Ichiro Abe, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 154 days.

(21) Appl. No.: 12/260,790

(22) Filed: Oct. 29, 2008

(65) Prior Publication Data
US 2009/0109773 A1 Apr. 30, 2009

(30) Foreign Application Priority Data
Oct. 30, 2007 (JP) .............................. 2007-281165

(51) Int. Cl.
*G11C 7/00* (2006.01)

(52) U.S. Cl. ...................... 365/222; 365/200; 365/203; 365/230.03

(58) Field of Classification Search ................. 365/222, 365/200, 203, 230.03, 230.06, 230.08
See application file for complete search history.

(56) References Cited

U.S. PATENT DOCUMENTS

| 6,310,803 B1 | 10/2001 | Hidaka |
| 6,590,815 B2 * | 7/2003 | Mine ........................... 365/200 |
| 7,099,208 B2 * | 8/2006 | Okuyama et al. ........... 365/200 |

FOREIGN PATENT DOCUMENTS

| JP | 2000-187995 A | 7/2000 |
| JP | 2000-294748 A | 10/2000 |

* cited by examiner

*Primary Examiner*—David Lam
(74) *Attorney, Agent, or Firm*—Sughrue Mion, PLLC

(57) ABSTRACT

In order to successively perform refresh operations, a semiconductor device has a plurality of regions performing a repair independently from each other, even when the repair is carried out in the region by a replacement with a repair memory block included in a plate included in each region. Specifically, the successive refresh operations are performed by alternately activating word lines in the respective regions so as to ensure a sufficiently long precharge period.

20 Claims, 7 Drawing Sheets

REPAIR WORD LINE GROUP

PLATE INCLUDING REPAIR WORD LINES

SENSE AMPLIFIER ROW

SEMICONDUCTOR DEVICE AND REFRESH METHOD

This application is based upon and claims the benefit of priority from Japanese Patent Application No. 2007-281165, filed Oct. 30, 2007, the disclosure of which is incorporated herein in its entirety by reference.

BACKGROUND OF THE INVENTION

This invention relates to a semiconductor device and a refresh method of refreshing the semiconductor device.

As described in Japanese Laid-Open Patent Publication No. 2000-187995 (Patent Document 1), in a semiconductor device has been usually adopted a method of remedying or repairing defective memory cells, if any, by replacing the defective memory cells with spare memory cells and by improving the yield of the semiconductor devices.

In Patent Document 1, description is also made about a technique of remedying or repairing the semiconductor device by preparing a plurality of normal blocks including normal memory cells and a spare block including a plurality of spare memory cells and by substituting the spare block in response to an external address signal. Further, in Patent Document 1, repairing by substituting the spare block is performed by detecting whether the semiconductor device is in a normal mode or in a refresh mode, and by selecting a gate with reference to a result of spare judgment on detection of the refresh mode.

On the other hand, Japanese Laid-Open Patent Publication NO. 2000-294748 (Patent Document 2) discloses a technique of preparing a plurality of memory cell arrays and a redundant cell array in each cell array block and sharing the redundant cell array by a plurality of the memory cell arrays. Description is also made in Patent Document 2 about drawbacks of this technique. Further, Patent Document 2 proposes a so-called block redundancy method of preparing a redundant cell array in each of cell array blocks and a semiconductor device which is capable of repairing defects without impairing its rapid access function.

SUMMARY OF THE INVENTION

Disclosure is made at all in Patent Document 1 neither about an auto-refresh operation which is performed by raising or activating the same word line several times during a single auto-refresh operation nor about problems that would be caused to occur in such a case.

On the other hand, no disclosure is made in Patent Document 2 about an auto-refresh mode performed by using a block redundancy method, and about any problems associated with the auto-refresh mode in the block redundancy method.

Specifically, an auto-refresh operation in a semiconductor device such as a DRAM will be described with reference to FIG. 7. FIG. 7 shows only one bank or array for the sake of simplification of explanation. The illustrated bank is divided into four plates which may be might to correspond to four memory blocks and which each share a row of sense amplifier, while only two plates are designated by P1 and P2 in FIG. 7. As shown in FIG. 7, the plate P1 includes a normal word line group and a repair word line group. In FIG. 7, only one word line of the normal word line group is denoted by R1 and only one repair word line of the repair word line group is denoted by R3. The illustrated plate P1 is provided with a sense amplifier row. A pair of bit lines B1T and B1B is connected to a sense amplifier of the sense amplifier row so that the pair of the bit lines crosses the word lines.

On the other hand, the plate P2 also includes a normal word line group and a repair word line group. In this figure, only one repair word line of the repair word line group is denoted by R2. In this example, it is assumed that the word line R2 of the plate P2 is replaced by the word line R3 of the plate P1. This means that the address of the word line R2 of the plate P2 is replaced by that of the word line R3 of the plate P1.

In a refresh operation, particularly in an auto-refresh operation, word lines are addressed and activated plural times in response to one auto-refresh command. In the auto-refresh operation, control operation is usually carried out such that a circuit which designates each of the word lines plural times does not continuously or successively activate each word line in the same plate (e.g. plate P1). Specifically, the control operation is performed in the auto-refresh operation so that the word line R2 of the plate P2 is activated after the word line R1 of the plate P1 is activated.

However, as shown in FIG. 7, if the word line R2 on the plate P2 which is replaced by the repair word line R3 is selected next to the word line R1 on the plate P1, the word lines R1 and R3 on the same plate P1 will be raised or activated continuously since the word line R2 has been replaced by the repair word line R3 on the plate P1.

If the word lines R1 and R3 in the same plate P1 are continuously raised or activated during the auto-refresh operation in this manner, the precharge time in the plate P1 will be shortened. This causes a problem that sufficient precharge cannot be performed. Accordingly, in a semiconductor device such as a DRAM, when a word line is activated, a pair of bit lines corresponding to the word line must be precharged after a lapse of an active period after the activation of the word line. It is therefore necessary to ensure enough time to precharge the bit lines after the activation of the word line. Nevertheless, the auto-refresh operation as described above cannot ensure a sufficient precharge time.

Therefore, it takes a long time after a word line is activated until it is activated next time. The active period in the refresh period must be short in order to ensure a sufficient precharge time.

SUMMARY OF THE INVENTION

According to an embodiment of this invention, a DRAM is configured such that, when word lines are activated plural times during a single auto-refresh operation, word lines in the same plate, in other words, word lines sharing the same bit lines are not activated continuously, whereby it is possible to shorten, during auto-refresh operation, a period of time between a falling time of a word line and a rise-up time of a next word line. Thus, it is possible to obtain a semiconductor device capable of prolonging the active period and ensuring a longer restore time in the same refresh period.

In an embodiment of this invention, there is provided a refresh method for a semiconductor device which is divided into a plurality of regions and which includes plates having a repair memory block in a predetermined one of the regions, wherein: successive refresh operations are performed by activating word lines plural times in response to one refresh command; and the word lines of the plates of the regions different from each other are activated every time the word lines are activated during the successive refresh operations, even when a replacement has been performed for the repair memory block in the predetermined region.

In another embodiment according to this invention, there is provided a semiconductor device which is divided into a plurality of regions and which includes plates having a repair memory block in a predetermined one of the regions. The semiconductor device comprises a unit which receives addresses designating plates in the regions during each refresh operation when a plurality of refresh operations are successively performed, to output a signal indicating whether or not a replacement with the repair memory block has been performed in the predetermined region; and a unit which selectively activates the plate including the repair memory block in the predetermined region if the signal indicates that the replacement with the repair memory block has been performed.

As mentioned above, configuration is made such that the same plate is not activated successively. At any rate, each region is intermittently or alternately put into an active state and a precharge of each region is carried out through bit lines during intermittent or every other active state. Therefore, a period of time corresponding to one word operation is ensured between a falling time point of a certain word line and a rise time point of a next word line during each auto-refresh operation. Therefore, the period of time from a falling time point of a word line to a rising time point of a next word line can be shortened in comparison with the prior art. This makes it possible to achieve a longer active period in the same refresh operation period tRFC and to ensure a sufficient restore time.

BRIEF DESCRIPTION OF THE DRAWINGS

The above-mentioned features and advantages of this invention will be more apparent from the following description of certain preferred embodiments taken in conjunction with the accompanying drawings, in which.

DESCRIPTION OF THE EXEMPLARY EMBODIMENTS

Figure 1:
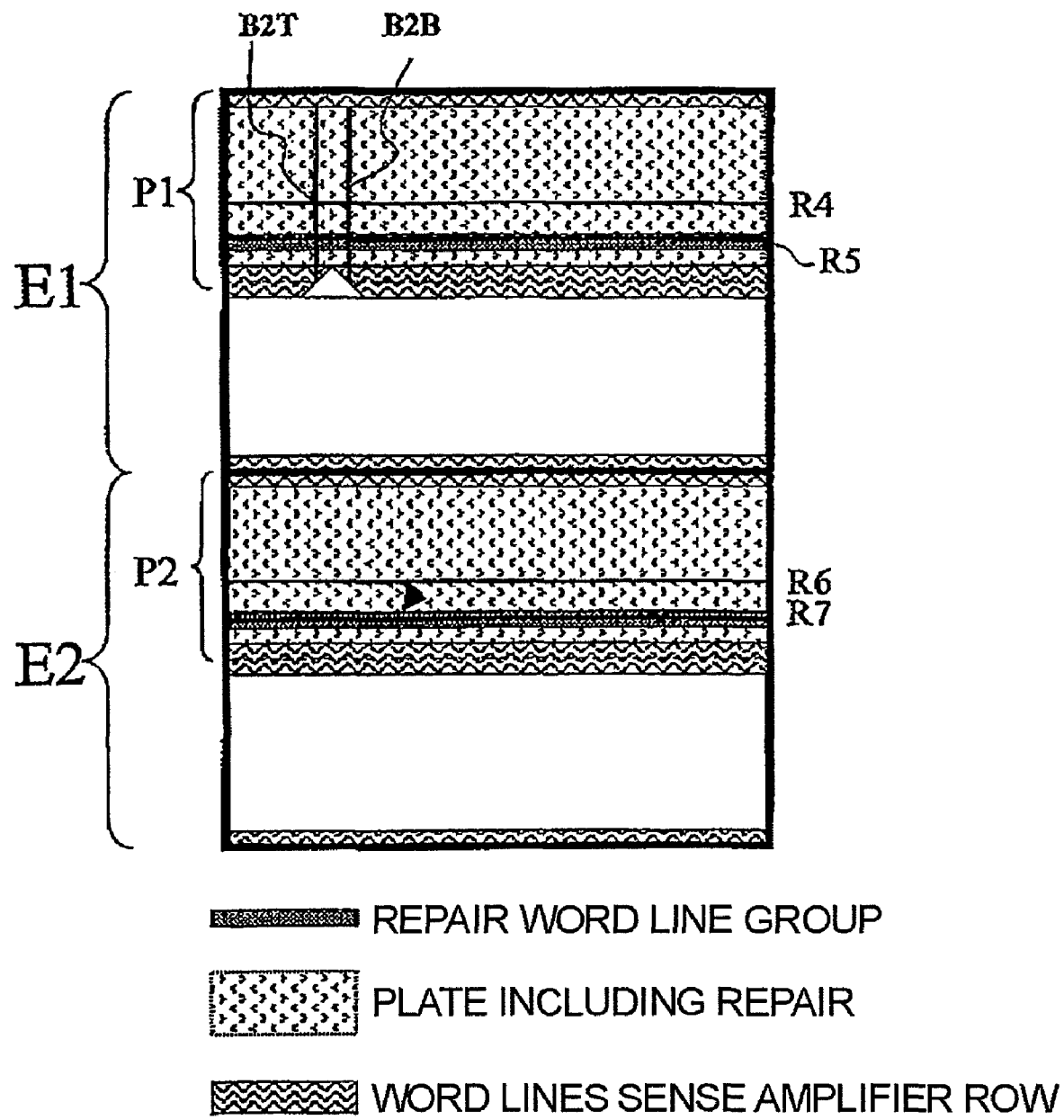
FIG. 1 is a schematic diagram for explaining a principle of a semiconductor device according to this invention.

Referring to FIG. 1, a semiconductor device according to a principle of this invention will be described. The illustrated semiconductor device is specified by a DRAM simplified by its single bank. The illustrated bank is divided into two regions E1 and E2. It is assumed here that these bank regions E1 and E2 are identified by higher-order bits of X addresses (for example, X10 when X address is represented by X0 to X10 bits), and each provided with a repair region independently from each other. The following more specific description will be made on the assumption that each of the regions E1 and E2 has two plates, and only one of the plates of the respective regions E1 and E2 are denoted by P1 and P2 in FIG. 1. Each plate P1 and P2 is provided with a repair memory block while the other plate is not provided with a repair memory block. This shows that the repair memory block in each region E1 and E2 is shared by the plates included in each region E1 and E2.

Specifically, the plate P1 in the region E1 includes a normal memory block, a repair memory block, and a sense amplifier row. In addition, a pair of bit lines B2T and B2B is derived from each sense amplifier of the sense amplifier row. In this example, a word line R4 in the plate P1 is repaired by being replaced by a repair word line R5 in the plate P1. On the other hand, like the plate P1, the plate P2 in the region E2 also includes a normal memory block, a repair memory block, and a sense amplifier row. A word line R5 is repaired by being replaced by a repair word line R7 in the plate P2. The illustrated semiconductor device thus has repair regions which are independent from each other in the plates P1 and P2, so that any defect in the region E1 is repaired by using only a repair word line in the region E1, and likewise, any defect in the region E2 is repaired by using only a repair word line in the region E2.

An auto-refresh operation of the shown semiconductor device (i.e., DRAM) will be described. The semiconductor device is configured such that, during an auto-refresh operation, the regions E1 and E2 are alternately activated when word lines are activated plural times. For example, when the word line R4 in the region E1 and the word line R6 in the region E2 are successively and continuously activated, word lines in the same plate P1 as the word line R4 are not successively activated even if the word line R6 in the region E2 is replaced by the repair word line R7 in the region E2.

Figure 2:
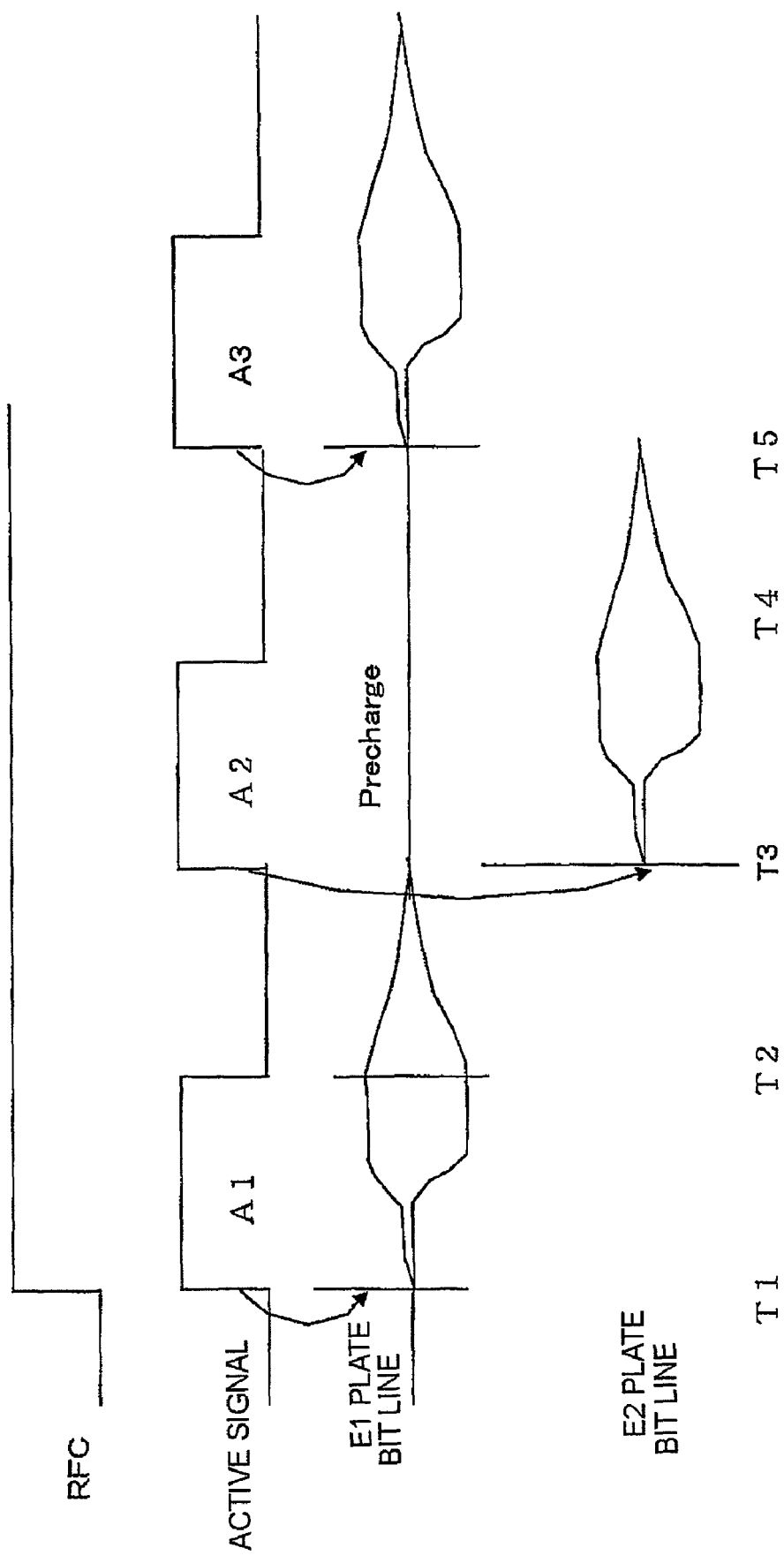
FIG. 2 is a time chart for explaining operation of the semiconductor device shown in FIG. 1.

Referring to FIG. 2, description will be made about an operation in the regions E1 and E2 which is carried out in response to a single auto-refresh command RFC. FIG. 2 shows active signals supplied to the word lines R4 and R6 in the regions E1 and E2 while the auto-refresh command RFC is being given, as illustrated in the uppermost row of FIG. 2.

In response to the auto-refresh command, every other active signal, such as A1 and A3, is distributed to the word lines in the region E1, whereas the active signal A2 is distributed to the word lines in the region E2. When the active signal A1 is supplied to the word line R4 in the region E1, the word line R4 is refreshed. After that, the bit lines on the corresponding plate P1 in the region E1 are put into a precharge state. When the active signal A2 is supplied to the word line R6 in the region E2, as shown in FIG. 2, the bit lines on the plate of the region E2 are put into a precharge state.

In this manner, a sufficient refresh and precharge time can be ensured in a period of time from a timing T1 at which the active signal A1 rises up until a timing T5 at which the active signal after the next one rises. A period of time between the rising timing T1 of the active signal A1 and a falling timing T2 of the active signal A1 can be prolonged enough to ensure a restore time.

In this manner, when word lines are raised plural times during the single auto-refresh operation, word lines of the plates are continuously raised in the different repair memory blocks of the different regions E1 and E2 in the auto-refresh operation, while word lines of the same plate will never be raised continuously no matter how repairing is performed.

As shown by the bit line waveform in FIG. 2, the bit lines may be precharged at least in a precharge time defined between the timing T2 at which the active signal A1 falls and the timing T5 at which every other active signal A3 rises. As a result, the precharge time can be set longer in comparison with a conventional auto-refresh operation. Conversely, if the precharge time as the conventional one suffices in the present invention, the duration of time from the first active operation to the next active operation can be reduced.

Figure 3:
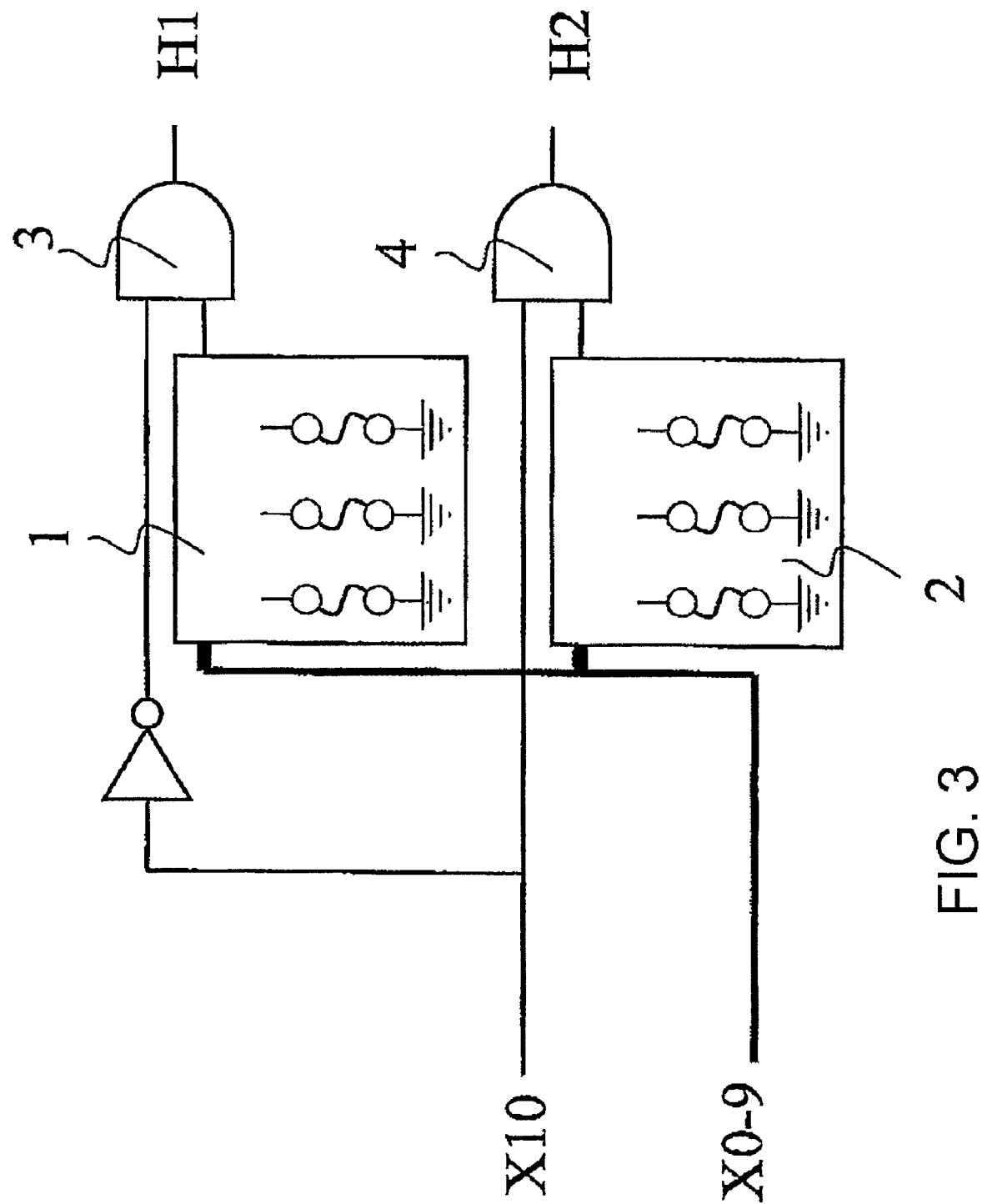
FIG. 3 is a block diagram for explaining a circuit for operating the semiconductor device shown in FIG. 1.

Referring to FIG. 3, description will be made about a circuit which performs repair judgment and selects the regions E1 and E2 alternately, when one bank has X addresses represented by eleven bits from 0 to 10. In this case, the illustrated circuit includes a fuse circuit which performs repair judgment based on the addresses X0 to X9 and X10, and outputs hit signals H1 and H2 on the basis of the repair judgment. Specifically, when the X10 is low, the hit signal H1 is output via an inverter, a fuse set 1, and an AND circuit 3, whereas when X10 is high, the hit signal H2 is output via a fuse set 2 and an AND circuit 4. When the fuse sets 1 and 2 perform repair judgment based on only X0 to X9, and the repairing address X10=0, the hit signal H1 is output. When X10=1, in contrast, the hit signal H2 is output. Thus, the fuse sets 1 and 2 shown in FIG. 3 each operate as a circuit for outputting a signal indicating whether or not a repair memory block in the regions E1, E2 has been replaced.

Figure 4:
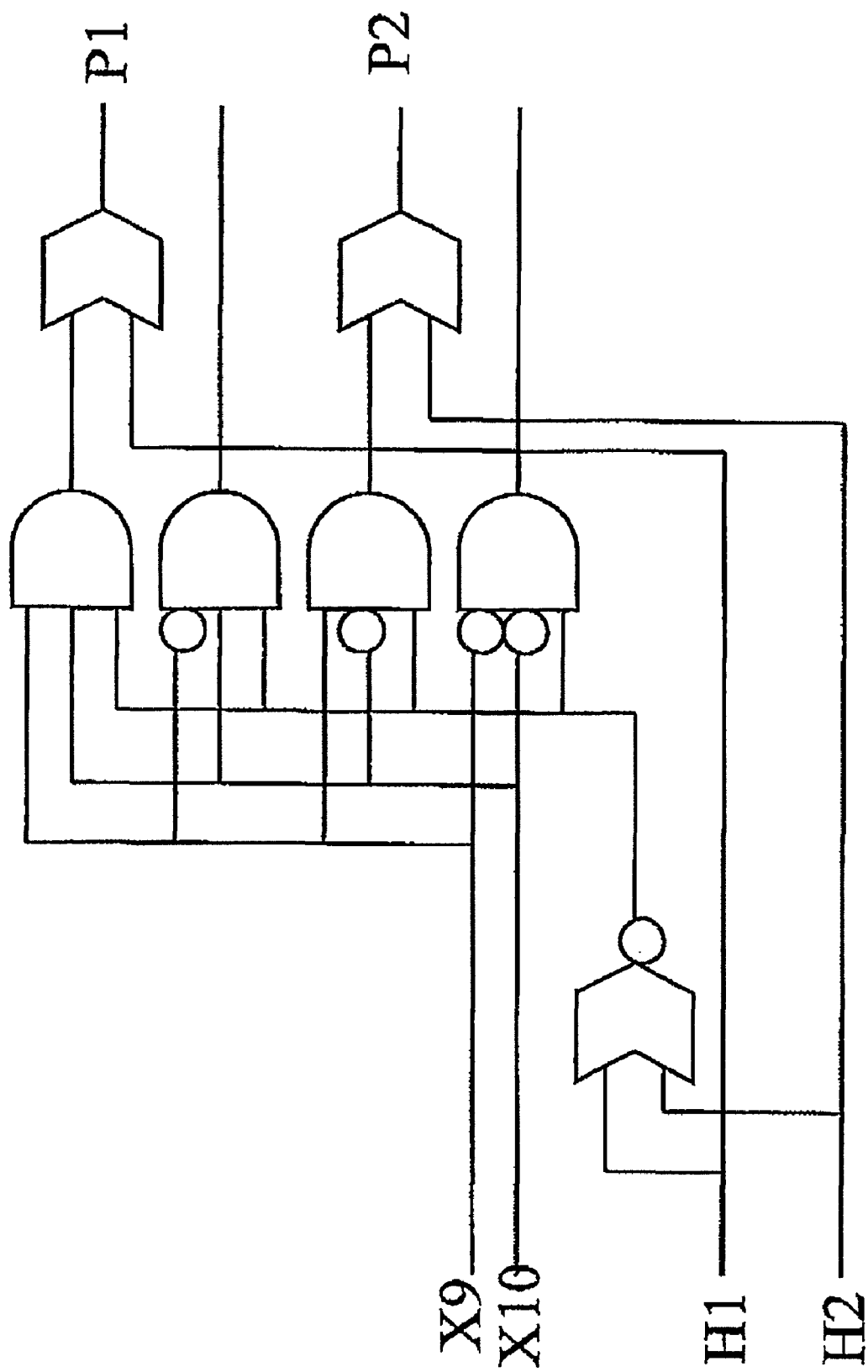
FIG. 4 is a circuit diagram showing a pre-decoder circuit for decoding an output of the circuit shown in FIG. 3.

Referring to FIG. 4, a pre-decoder circuit is illustrated which is supplied with the hit signals H1 and H2 and the addresses X9 and X10 shown in FIG. 3. The pre-decoder circuit illustrated in FIG. 4 outputs a pre-decode signal P1 (delivered to the plate P1 and shown by the same reference symbol) when the plate P1 is activated, whereas the pre-decoder circuit outputs a pre-decode signal P2 when the plate P2 is activated. In the circuit shown here, the hit signal H1 is delivered to the plate P1 only when X10=0 and only the plate P1 is activated. On the other hand, the plate P2 is activated when X10=1.

Figure 5:
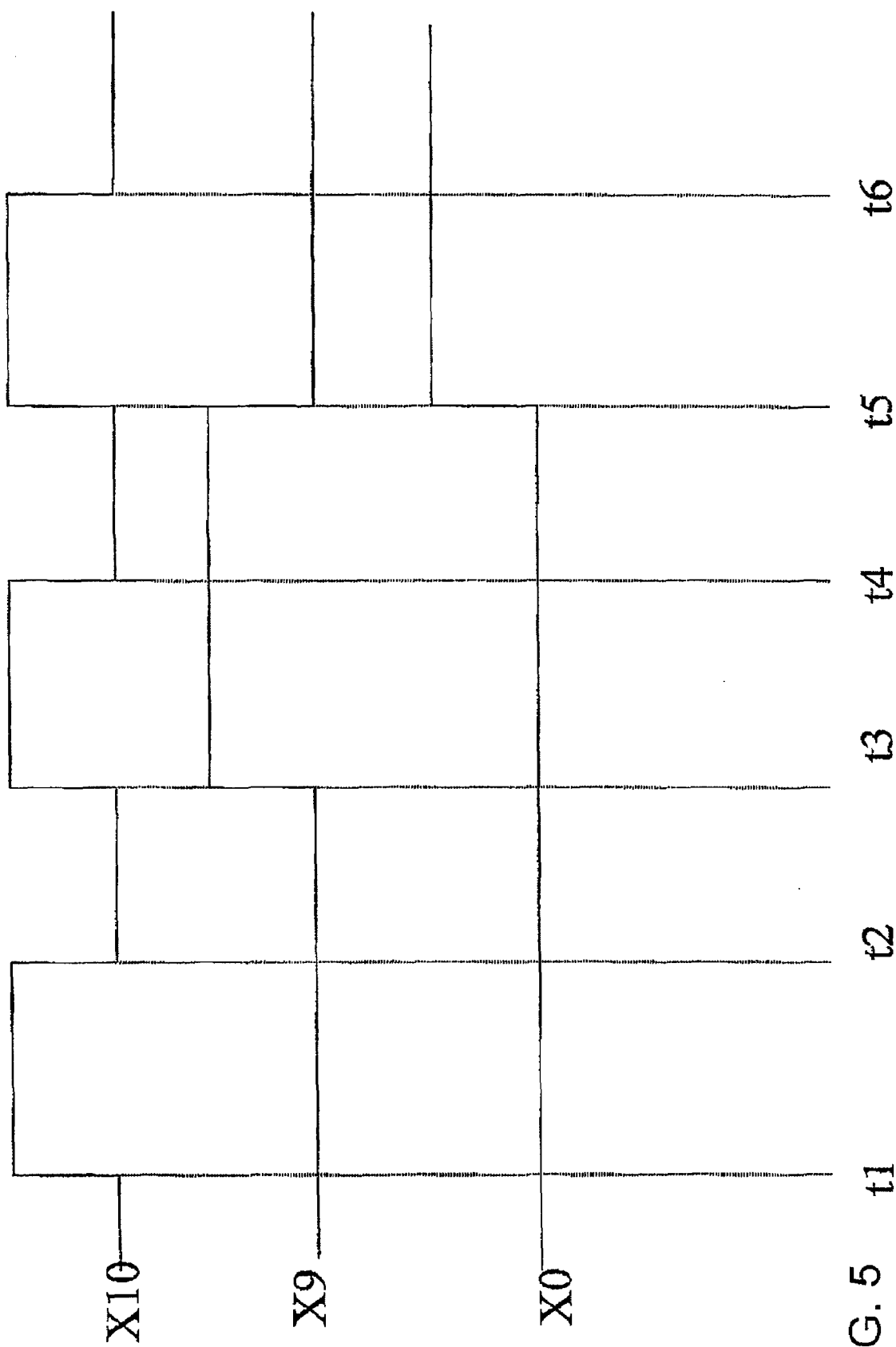
FIG. 5 is a waveform diagram for explaining address signals supplied to the circuits shown in FIG. 3 and FIG. 4.

If the pre-decoder circuit shown in FIG. 4 is supplied with addresses during the auto-refresh operation such that X10 alternately becomes 0 and 1 as shown in FIG. 5, the plate P2 will not become active when X10=0, and conversely the plate P1 will not become active when X10=1. Therefore, the same plate never becomes active successively or continuously. Thus, the pre-decoder circuit shown in FIG. 4 operates as a circuit for outputting a signal which designates either the plate P1 in the region E1 or the plate P2 in the region E2.

Although description of the embodiment above has been made in terms of the case where an independent repair region is provided with a single one of the plates that includes the repair word, the independent repair region may be provided with a plate including a plurality of repair words. Alternatively, two or more refresh operations may be performed in response to a single refresh command.

Figure 6:
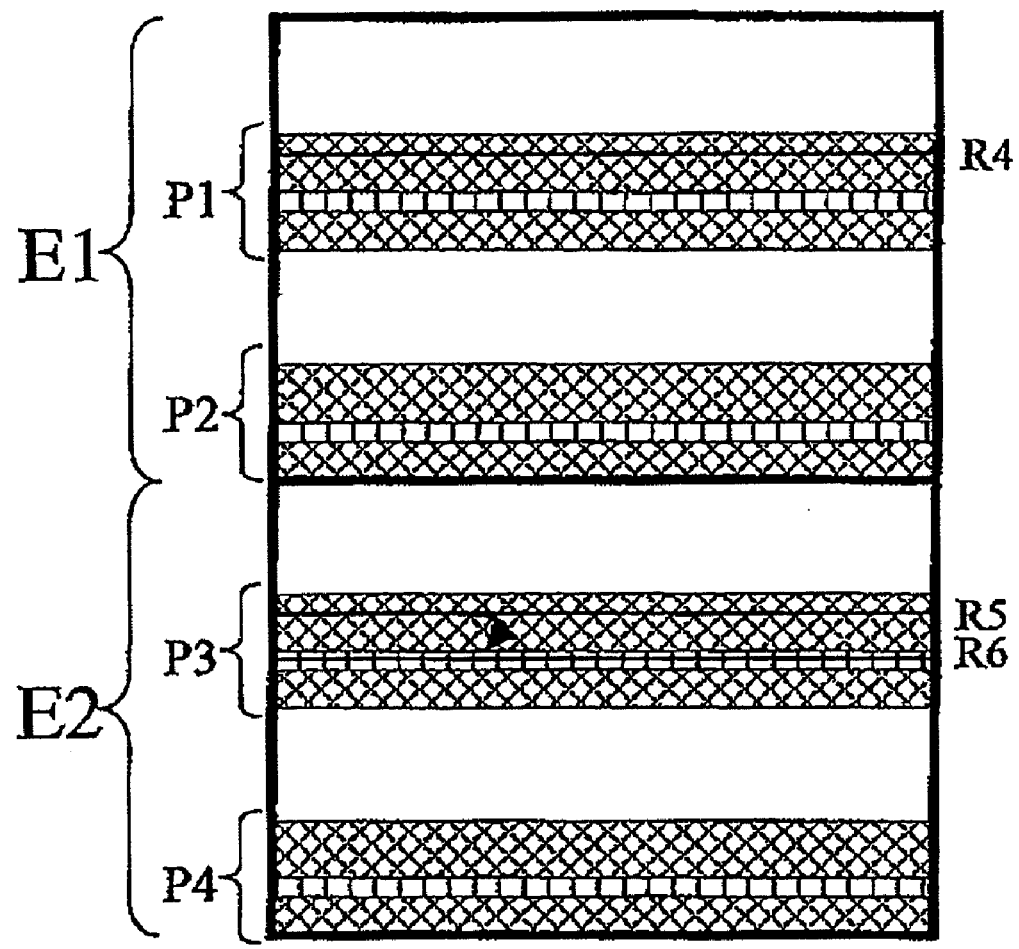
FIG. 6 is a diagram showing a schematic configuration of a semiconductor device according to another embodiment of this invention.
Figure 7:
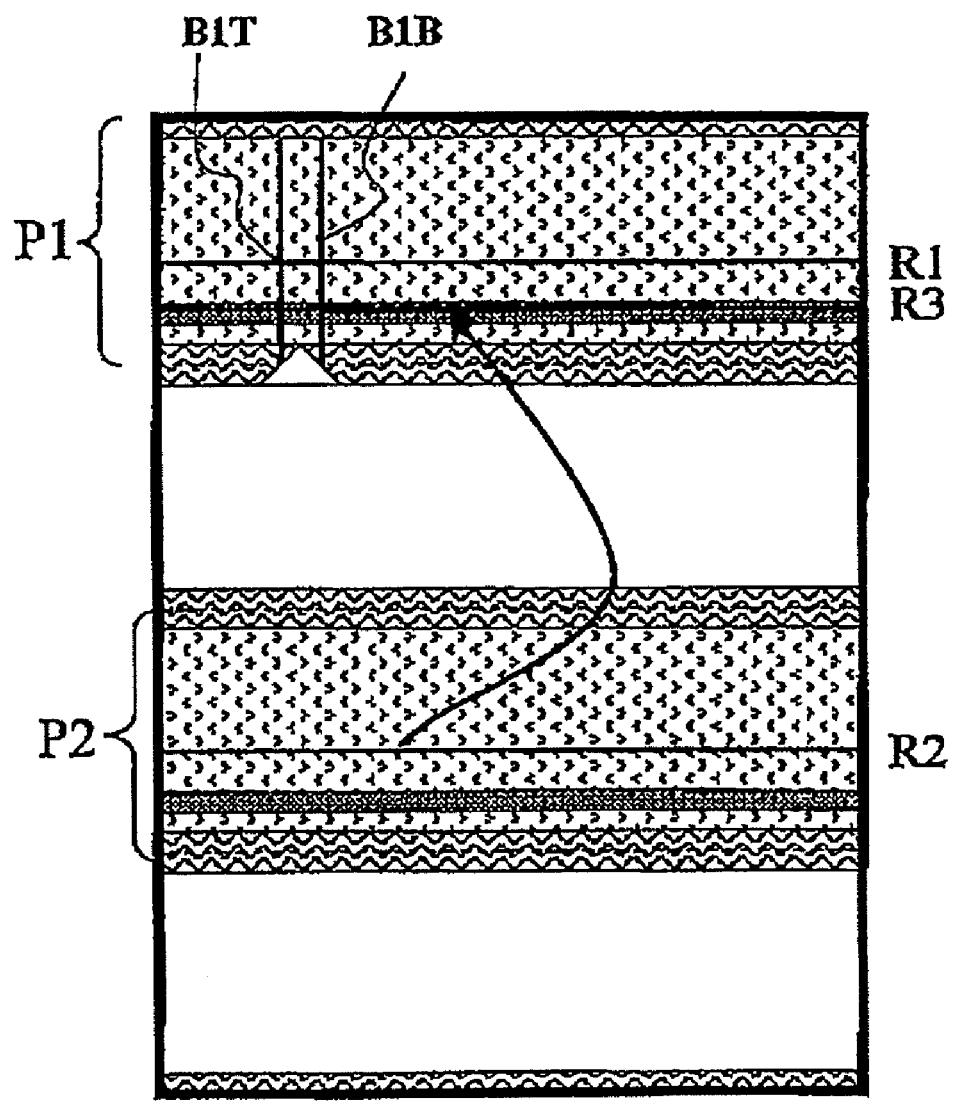
FIG. 7 is a schematic diagram showing a configuration of a prior art semiconductor device.
Figure 7:
Figure 7:
Figure 7:

Referring to FIG. 6, a semiconductor device according to another embodiment of this invention includes each of the regions E1 and E2 that is provided with two plates each including a repair word. Like the embodiment described above, repair regions P1 and P2, and repair regions P3 and P4 in the respective regions E1 and E2 are independent of each other. If a method is employed to access the regions E1 and E2 alternately during auto-refresh operation, the same plate will never be continuously activated regardless of whether or not repairing is performed. At any rate, a sufficient precharge time can be ensured and a longer restore time can be achieved than the prior art.

This invention is widely applicable to semiconductor devices having repair plates and successively performing refresh operations. This invention is applicable to circuits for performing not only an auto-refresh operation but also a self-refresh operation.

Although this invention has been described in conjunction with a few preferred embodiments thereof, this invention is not limited to the foregoing embodiments but may be modified in various other manners within the scope of the appended claims.

What is claimed is:

1. A refresh method for a semiconductor device divided into a plurality of regions each of which includes plates, the refresh method comprising:

preparing a repair memory block in a selected one of the plates;

successively performing refresh operations of the plurality of the regions by activating word lines plural times in response to one refresh command;

wherein:

successive refresh operations are performed by activating the word lines of the plates included in different ones of the regions even when the repair memory block is replaced in the selected one of the plates.

2. The refresh method as claimed in claim 1, wherein the semiconductor device is divided into two regions, and the word lines are activated twice in response to the one refresh command.

3. The refresh method as claimed in claim 2, wherein the two regions are alternately activated in response to the one refresh command to thereby successively perform the refresh operations in the two regions.

4. The refresh method as claimed in claim 3, wherein the precharge is performed within each of the regions between an active state and every other active state by the use of bit lines of each plate.

5. The refresh method as claimed in claim 1, wherein a precharge is performed by using bit lines of each plate within each of the regions during each of the refresh operations.

6. The refresh method as claimed in claim 1, wherein same plate never becomes active in successive refresh operations when the repair memory block is replaced in the selected one of the plates.

7. The refresh method as claimed in claim 1, wherein the repair memory block is shared by the plates in the plurality of regions.

8. A semiconductor device comprising:

a plurality of regions each including plates a selected one of which has a repair memory block;

a unit which receives addresses designating the plates in the respective regions during each refresh operation when a plurality of refresh operations are successively performed, to output a signal indicating whether or not the repair memory block is replaced in the selected one of the plates; and a unit which selectively activates the selected one of the plates including the repair memory block by activating word lines of the plates included in different ones of the regions even when the signal indicates that the replacement with the repair memory block is performed.

9. The semiconductor device as claimed in claim 8, further comprising:

an additional repair memory block included in the region different from the region having the selected one of the plates.

10. The semiconductor device as claimed in claim 9, wherein the replacement is performed for the plates each having the repair memory block in the plurality of regions independently from each other.

11. The semiconductor device as claimed in claim 10, wherein the replacement of the plates is performed by designating word lines.

12. The semiconductor device as claimed in claims 9, wherein the replacement of the plates is performed by alternately switching the regions.

13. The semiconductor device as claimed in claim 8, wherein the semiconductor device is divided into two regions, and the word lines are activated twice in response to one refresh command.

14. The semiconductor device as claimed in claim 13, wherein the two regions are alternately activated in response to the one refresh command to thereby successively perform the refresh operations in the two regions.

15. The semiconductor device as claimed in claim 8, wherein same plate never becomes active in successive refresh operations when the repair memory block is replaced in the selected one of the plates.

16. The semiconductor device as claimed in claim 8, wherein the repair memory block is shared by the plates in the plurality of regions.

17. A semiconductor device comprising:

a memory bank including at least first and second regions, each of the first and second regions comprising a normal memory block and a repair memory block, a defect memory cell contained in the normal memory block of the first region being configured to be replaced with a repair memory cell contained in the repair memory block of the first region so that the repair memory block of the second region is free from being used for replacing the defect memory cell of the normal memory block of the first region, and a defect memory cell contained in the normal memory block of the second region being configured to be replaced with a repair memory cell contained in the repair memory block of the second region so that the repair memory block of the first region is free from being used for replacing the defect memory cell of the normal memory block of the second region; and a circuit performing, in response a refresh request, at least two refresh operations, a first one of the at least two refresh operations being performed on the first region and a second one of the at least two refresh operations being performed on the second region.

18. The semiconductor device claimed in claim 17, wherein the at least two refresh operations are performed successively so that after the first one of the at least two refresh operations has been performed on the first region, the second one of the at least two refresh operations is performed on the second region.

19. The device as claimed in claim 17, each of the first and second regions further comprises a sense amplifier circuit, the sense amplifier of the first region being activated in response to the refresh operation on the first region and then brought into a precharge state, the sense amplifier circuit of the second region being activated during the precharge state of the sense amplifier of the first region in response to the refresh operation on the second region.

20. The device as claimed in claim 17, wherein each of the normal memory blocks of the first and second regions includes a plurality of normal word lines and each of the repair memory blocks of the first and second regions includes a plurality of repair word lines, one of the repair word lines of one of the first and second regions being activated in place of one of the normal word lines of the one of the first and second regions in response to one of the at least two refresh operations, and one of the normal word lines of the other of the first and second regions being activated in response to the other of the at least two refresh operations.

* * * * *